United States Patent [19]
Mantani

[11] Patent Number: 5,568,138
[45] Date of Patent: Oct. 22, 1996

[54] SERVO-CONTROLLING SYSTEM INCORPORATED IN KEYBOARD INSTRUMENT FOR PROCESSING PARALLEL INPUT SIGNALS IN TIME SHARING FASHION

[75] Inventor: Rokurota Mantani, Hamamatsu, Japan

[73] Assignee: Yamaha Corporation, Shizuoka-ken, Japan

[21] Appl. No.: 439,984

[22] Filed: May 12, 1995

Related U.S. Application Data

[63] Continuation-in-part of Ser. No. 181,200, Jan. 31, 1994, abandoned.

[30] Foreign Application Priority Data

Jan. 14, 1993 [JP] Japan .......................... 5-5433

[51] Int. Cl.[6] .................................. H03K 17/94
[52] U.S. Cl. .................................. 341/20; 84/21
[58] Field of Search .......................... 341/20, 22; 84/13, 84/19–21, 645, 462

[56] References Cited

U.S. PATENT DOCUMENTS

| | | | |
|---|---|---|---|
| 4,843,936 | 7/1989 | Murakami et al. | 84/20 X |
| 4,913,026 | 4/1990 | Kaneko et al. | 84/21 |
| 5,083,491 | 1/1992 | Fields | 84/21 |
| 5,200,562 | 4/1993 | Kaneko et al. | 84/21 |

*Primary Examiner*—Thomas Mullen
*Attorney, Agent, or Firm*—Graham & James LLP

[57] ABSTRACT

A servo-controlling system incorporated in an automatic player piano selects detecting signals each indicative of actual status of a key or a pedal to be manipulated from all of the detecting signals, and sequentially fetches the selected detecting signals in a time sharing fashion for comparing the selected detecting signals with reference signals each indicative of target status of the key or the pedal, thereby promptly controlling actuators associated with the keys and pedals to be manipulated without complex wiring network.

9 Claims, 11 Drawing Sheets

SERVO-CONTROLLING SYSTEM INCORPORATED IN KEYBOARD INSTRUMENT FOR PROCESSING PARALLEL INPUT SIGNALS IN TIME SHARING FASHION

RELATED APPLICATION

This application is a continuation-in-part of U.S. Ser. No. 08/181,200 filed Jan. 13, 1994, now abandoned, which application is incorporated herein by reference.

FIELD OF THE INVENTION

This invention relates to a servo-controlling system and, more particularly, to a servo-controlling system incorporated in a keyboard instrument for producing parallel input signals.

DESCRIPTION OF THE RELATED ART

An automatic player piano is equipped with solenoid-operated actuator units in association with a keyboard and pedal mechanisms, and the solenoid-operated actuator units manipulate the keys and the pedals instead of a player in a playback mode. Namely, the solenoid-operated actuator units form feedback loops together with key and pedal sensors and servo-controllers, and move the keys and the pedals to target positions instructed by a controller.

FIG. 1 shows a typical example of the servo-controllers 11, 12, . . . , in forming parts of feedback loops for keys and pedals (not shown), and the servo-controllers 11 to 1n are of an analog type. The number of the servo-controllers 11 to 1n are equal to the total number of the keys and the pedals, and is typically ninety.

While the automatic player piano is performing music, a controller (not shown) selectively changes reference signals REF1, REF2, . . . , REFn indicative of the target positions, and the servo-controllers 11 to 1n compare detecting signals SEN1, SEN2, . . . , SENn indicative of actual positions of the keys and pedals with the reference signals REF1 to REFn, respectively. The detecting signals SEN1 to SENn are supplied from the key sensors and the pedal sensors to the associated servo-controllers 11 to 1n, and the output signals OUT1, OUT2, . . . , OUTn are respectively produced by the servo-controllers 11 to 1n. The magnitudes of the output signals OUT1 to SENn are proportional to deviations of the actual positions from the target position, and the servo-controllers 11 to 1n determine the output signals OUT1 to OUTn in such a manner that the associated solenoid-operated actuators minimize the deviations.

If one of the servo-controllers 11 to 1n finds that the associated key or pedal does not reach the target position, the servo-controller increases the magnitude of the output signal, and accelerates the solenoid-operated actuator unit. On the other hand, if another servo-controller notices that the associated key or pedal overruns the target position, the servo-controller decreases the magnitude of the output signal, and the solenoid-operated actuator unit corrects the actual position. Thus, the feedback loops independently control the associated keys and pedals.

FIG. 2 shows another prior art servo-controlling system, and consists of a plurality of servo-controlling sub-systems. Each of the servo-controlling sub-systems has twelve channels, and, accordingly, twelve keys or twelve keys/pedals are assigned to each servo-controlling subsystem.

Each of the servo-controlling sub-systems comprises two time-shared input switching units 13 and 14, a servo-controller implemented by a digital signal processor unit 15 and a time-shared output switching unit 16. The time-shared input switching unit 13 is coupled with the twelve output ports of a controller (not shown), and digital reference signals REF1, REF2, . . . , REF12 indicative of target positions are supplied from the controller to the time-shared input switching unit 13. On the other hand, the time-shared input switching unit 14 is coupled through analog-to-digital converters (not shown) with twelve key sensors (not shown) or twelve key/pedal sensors (not shown), and digital detecting signals indicative of actual positions are supplied to the time-shared input switching unit 14.

The time-shared output switching unit 16 is coupled through digital-to-analog converters (not shown) with twelve solenoid-operated actuator units (not shown), and transfers digital output signals OUT1, OUT2, . . . , OUT12 through the digital-to-analog converters to the solenoid-operated actuator units.

The servo-controller 15 synchronizes the three time-shared switching units 13, 14 and 16, and calculates a deviation of the actual position from the target position for each channel.

For example, while the time-shared switching units 13, 14 and 16 are coupling the first ports with the servo-controller 15, the servo-controller 15 fetches the digital reference signal REF1 and the digital detecting signal SE1, and compares the actual position indicated by the digital detecting signal SE1 with the target position indicated by the digital reference signal REF1 to see whether or not the actual position is matched with the target position.

If the servo-controller 15 finds that the associated key or pedal does not reach the target position, the servo-controller 15 increases the value of the output signal OUT1, and accelerates the solenoid-operated actuator unit. On the other hand, if the servo-controller notices that the associated key or pedal overruns the target position, the servo-controller decreases the value of the output signal OUT1, and the solenoid-operated actuator unit corrects the actual position. Thus, the servo-controller 15 sequentially appoints the feedback loops for correction of the actual positions.

Although the first prior art servo-controlling system processes the detecting signals SE1 to SEn in a real time fashion, the first prior art servo-controlling system requires a large number of servo-controllers 11 to 1n and the parallel wirings between the servo-controllers 11 to 1n, the sensors and the solenoid-operated actuator units. The servo-controllers 11 to 1n are expensive, and consume a large amount of electric power. Moreover, the parallel wiring Makes the servo-controlling system complex and expensive. Therefore, the first prior art servo-controlling system encounters problems in production cost, the complexity and the high running cost.

On the other hand, the second prior art servo-controlling system is free from the problems inherent in the first prior art servo-controlling system. However, the second prior art servo-controlling system encounters a problem in response characteristics. Namely, if the channels are increased, the increased channels prolong time interval between the fetches of each detecting signal, and the servo-controller 15 hardly matches the actual positions with up-dated target positions.

Thus, there is a trade-off between the response characteristics and the production/running costs, and the prior art servo-controlling systems can not solve both problems.

SUMMARY OF THE INVENTION

It is therefore an important object of the present invention to provide a servo-controlling system for a keyboard instrument which is enhanced in response characteristics without increase of production/running costs.

To accomplish the object, the present invention proposes to select data codes indicative of tone information presently reproduced for servo-control.

In accordance with one aspect of the present invention, there is provided a servo-controlling system for controlling a plurality of movable members, comprising: a) a plurality of sensor means respectively associated with the plurality of movable members for producing a plurality of first data signals each indicative of actual status of the associated movable member, the actual status being variable with time; b) a plurality of first data storage means respectively associated with the plurality of sensor means for storing the plurality of first data signals in a rewritable manner; c) a control data source for sequentially producing a plurality of second data signals each indicative of target status of one of the plurality of movable members to be controlled, the plurality of second data signals being less in number than the plurality of first data signals; d) a plurality of second data storage means equal in number to the plurality of second data signals concurrently produced by the control data source for storing the plurality of second data signals; e) a data selecting means operative to select first data signals from the plurality of first data signals stored in the plurality of first data storage means, the selected first data signals being corresponding to the plurality of second data signals stored in the plurality of second data storage means; f) a plurality of third data storage means equal in number to the plurality of second data storage means for storing the selected first data signals; g) a first time shared input switching unit having first input ports respectively coupled with the plurality of second data storage means and a first output port, and sequentially connecting the first input ports with the first output port; h) a second time shared input switching unit having second input ports respectively coupled with the plurality of third data storage means and a second output port, and sequentially connecting the second input ports with the second output port in synchronous with the first time shared input switching unit; i) a time shared output switching unit having a third input port and a plurality of third output ports, and sequentially connecting the third input port with the plurality of third output ports in synchronous with the first and second time shared input switching units; j) a data processing means coupled with the first and second output ports, and operative to sequentially produce a plurality of control signals each indicative of a piece of control data information for matching the actual status with the target status, the plurality of control signals being sequentially supplied to the third input port; k) a plurality of fourth data storage means equal in number to the plurality of third data storage means, and operative to store the plurality of control signals in a rewritable manner; l) a plurality of fifth data storage means equal in number to the plurality of first data storage means for storing control signals larger in number than the plurality of control signals in a rewritable manner; m) a transfer means operative to transfer the plurality of control signals from the plurality of fourth data storage means to the plurality of fifth data storage means, the fifth data storage means supplied with the plurality of control signals being corresponding to the first data storage means where the selected first data signals were stored; and n) a plurality of actuator means respectively associated with the plurality of movable members, and respectively coupled with the plurality of fifth data storage means, each of the plurality of actuator means being responsive to one of the control signals for matching the actual status of the associated movable member with the target status.

In accordance with another aspect of the present invention, there is provided a keyboard instrument comprising: a) a plurality of keys turnable with respect to a stationary board member; b) a plurality of strings vibratory for producing tones; c) a plurality of hammer mechanisms associated with the plurality of strings, and rotatable for striking the associated strings; d) a plurality of key action mechanisms respectively coupled between the plurality of keys and the plurality of hammer mechanisms, and driving the associated hammer mechanisms when the associated keys are depressed; e) a plurality of pedal mechanisms each operative to change an impression of the tones when the pedal mechanism is manipulated; f) a plurality of key sensors respectively associated with the plurality of keys, and monitoring the associated keys for producing first data signals each indicative of actual status of the associated key; g) a plurality of pedal sensors respectively associated with the plurality of pedal mechanisms, and monitoring the associated pedal mechanisms for producing a plurality of second data signals each indicative of actual status of the associated pedal mechanism; h) a controller having h-1) a plurality of first data storage means equal in number to the total of the plurality of keys and the plurality of pedal mechanisms, and respectively associated with the plurality of keys and the plurality of pedal mechanisms for storing the plurality of first data signals and the plurality of second data signals in a rewritable manner, h-2) a control data source for sequentially producing a plurality of third data signals each indicative of target status of one of the plurality of keys or one of the plurality of pedal mechanisms to be controlled in a playback, the plurality of third data signals being less in number than the total of the plurality of first data signals and the plurality of second data signals, h-3) a plurality of second data storage means equal in number to the plurality of third data signals concurrently produced by the control data source for storing the plurality of third data signals in a rewritable manner, h-4) a data selecting means operative to select data signals from the plurality of first and second data signals stored in the plurality of first data storage means, the selected data signals being associated with the same keys and/or pedal as the plurality of third data signals stored in the plurality of second data storage means, h-5) a plurality of third data storage means equal in number to the plurality of second data storage means for storing the selected data signals in a rewritable manner, h-6) a first time shared input switching unit having first input ports respectively coupled with the plurality of second data storage means and a first output port, and sequentially connecting the first input ports with the first output port, h-7) a second time shared input switching unit having second input ports respectively coupled with the plurality of third data storage means and a second output port, and sequentially connecting the second input ports with the second output port in synchronous with the first time shared input switching unit, h-8) a time shared output switching unit having a third input port and a plurality of third output ports, and sequentially connecting the third input port with the plurality of third output ports in synchronous with the first and second time shared input switching units, h-9) a data processing means coupled with the first and second output ports, and operative to sequentially produce a plurality of control signals in synchronism with change between the first input and output ports and the second input and output ports signals, each of the plurality of control signals being indicative of a piece of control data information for matching the actual status of one of the plurality of keys or one of the plurality of pedal mechanisms with the target status thereof, the plurality of control signals being sequentially supplied to the third input port, h-10) a plurality of fourth data storage means equal in number to the plurality of first data storage means, and operative to store the plurality of control signals in a rewritable manner, h-11) a plurality of fifth data storage means equal in number to the plurality of first data storage means, and respectively associated with the plurality of keys and with the plurality of pedal mechanisms, h-12) a transfer means operative to transfer the plurality of control signals from the plurality of fourth data storage means to fifth data storage means selected from the plurality of fifth data storage means, the selected fifth data storage means being corresponding to the first data storage means where the selected data signals were stored; and i) a plurality of actuator units associated with the plurality of keys and with the plurality of pedal mechanisms, and respectively coupled with the plurality of fifth data storage means, each of the plurality of actuator units being responsive to one of the control signals for matching the actual status of the associated key or the associated pedal mechanism with the target status.

BRIEF DESCRIPTION OF THE DRAWINGS

The features and advantages of the servo-controlling system according to the present invention will be more clearly understood from the following description taken in conjunction with the accompanying drawings in which.

DESCRIPTION OF THE PREFERRED EMBODIMENTS

First Embodiment

Figure 3:
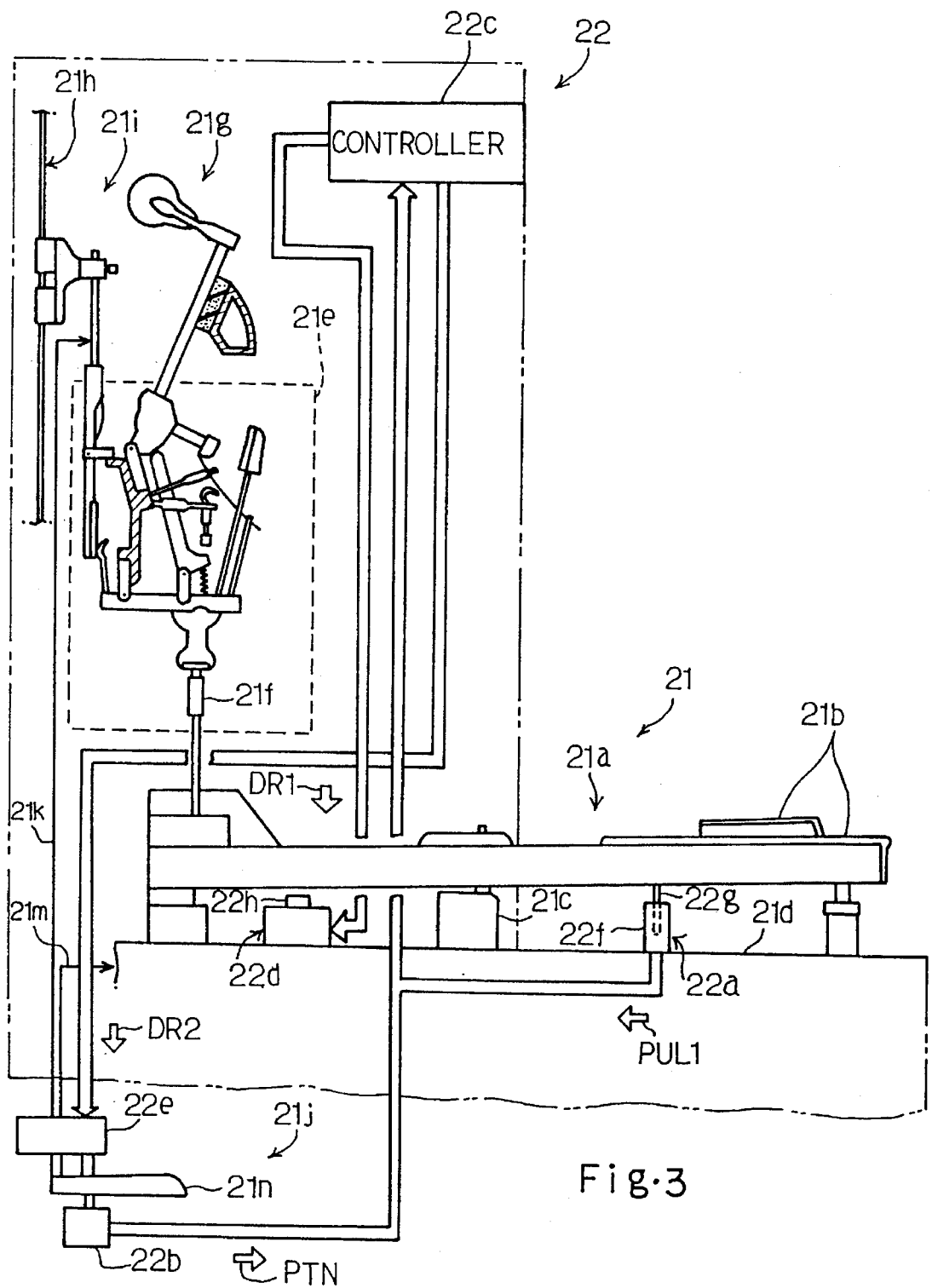
FIG. 3 is a side view showing the inside structure of an automatic player piano according to the present invention.

Referring to FIG. 3 of the drawings, an automatic player piano largely comprises an acoustic piano 21 and an automatic driving system 22, and selectively enters into a standard playing mode, a recording mode and a playback mode. In this instance, the acoustic piano is an upright piano. However, a grand piano may serve as the acoustic piano.

The acoustic piano 21 comprises a keyboard 21a, and the keyboard 21a is implemented by a plurality of black and white keys 21b turnably supported by a balance rail 21c on a key bed 21d.

The acoustic piano 21 further comprises a plurality of key action mechanisms 21e held in contact with capstan buttons 21f projecting from the rear end portions of the black and white keys 21b, respectively, a plurality of hammer mechanisms 21g respectively driven by the plurality of key action mechanisms 21e, and a plurality of sets of strings 21h respectively struck by the hammer mechanisms 21g.

While one of the black and white keys 21b is moving from the rest position to the end position, the associated key action mechanism 21e rotates the hammer mechanism 21g at low-speed toward the set of strings 21h, and, then, kicks it so that the hammer mechanism 21g rushes toward the set of strings 21h at high speed. The hammer mechanism 21g rebounds on the set of strings 21h, and the key action mechanism 21e stops the hammer mechanism 21g at the home position after the depressed key 21b is released from the end position.

The acoustic piano 21 further comprises a plurality of damper mechanisms 21i associated with the sets of strings 21h, and the damper mechanisms 21i are driven by the key action mechanisms 21e. While the keys 21b are in the rest position, the damper mechanisms 21i are held in contact with the sets of strings 21h, and prevent the strings from vibrating. However, if one of the keys 21b is depressed, the key action mechanism 21e separates the associated damper mechanism 21i from the set of strings, and the damper mechanism 21i allows the set of strings 21h to vibrate upon being struck with the hammer mechanism 21g. After the key is released from the end position, the damper mechanism 21i is brought into contact with the set of strings 21h again, and stops the strings 21h from vibrating.

The acoustic piano 21 further comprises a pedal mechanism 21j having a damper pedal sub-mechanism 21k for keeping the damper mechanisms 21i off and a soft pedal sub-mechanism 21m for decreasing the volume by causing fewer than the normal number of the strings to be struck. The damper pedal sub-mechanism 21k and the soft pedal sub-mechanism 21m are respectively connected with pedals 21n.

While a player is performing in the standard mode, the acoustic piano 21 sequentially produces sounds in response to the fingering on the keyboard 21a, as in an upright piano, and no further description is incorporated below for the sake of brevity.

In this instance, the black and white keys 21b and the pedals 21n serve as a plurality of movable members.

The automatic driving system 22 comprises an array of key sensors 22a for respectively monitoring the keys 21b, an array of pedal sensors 22b for respectively monitoring the pedals 21n, a controller 22c connected with the array of key sensors 22a and the array of pedal sensors 21b, and an array of solenoid-operated key actuators 22d and an array of solenoid-operated pedal actuators 22e coupled with the controller 22c.

Each of the key sensors 22a is implemented by the combination of a photo-coupler 22f mounted on the key bed 21d and a shutter plate 22g connected with the lower surface of the associated key 21b. Though not shown in the drawings, slits are formed in the shutter plate 22g, and slits sequentially permit the transmission of the output of the photo-coupler 22f. The photo-coupler 22f produces an electric pulse signal PUL1 at each slit, and the electric pulse signal PUL1 is supplied to the controller 22c.

Each of the pedal sensors 22b produces an analog positional signal PTN indicative of a present or actual position of the associated pedal 21n, and the analog positional signal PTN is also supplied to the controller 22c.

The solenoid-operated key actuators 22d are respectively provided for the keys 21b, and are mounted on the key bed 21d. The solenoid-operated key actuators 22d are responsive to key driving signals DR1 supplied from the controller 22c, and project the plungers 22h so that the corresponding keys 21b rotate around balance rail 21c as if a player had depressed them. The speed of plunger 22h is proportional to the magnitude of the key driving signal DR1.

The solenoid-operated pedal actuators 22e are interposed between links of the damper pedal sub-mechanism 21k and between links of the soft pedal sub-mechanism 21m, and are responsive to pedal driving signals DR2 also supplied from the controller 22c. The solenoid-operated pedal actuators 22e have respective plungers (not shown), and keep the plungers at the actual positions depending upon the magnitudes of the pedal driving signals DR2.

Figure 4:
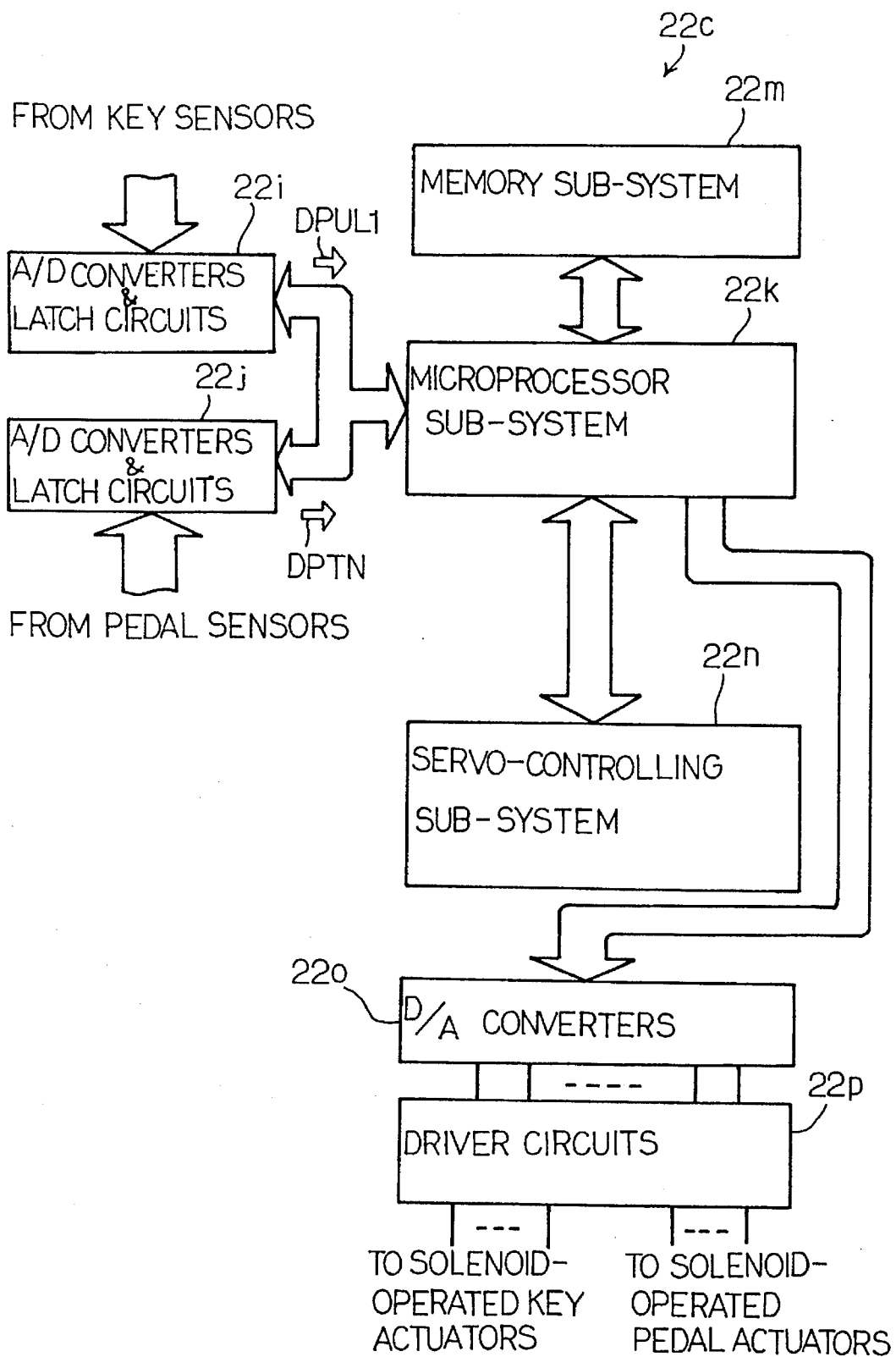
FIG. 4 is a block diagram showing the arrangement of a controller incorporated in the automatic player piano.

Turning to FIG. 4 of the drawings, the controller 22c comprises a plurality of analog-to-digital converters/latch circuits 22i coupled in parallel with the photo-couplers 22f, a plurality of analog-to-digital converters/latch circuits 22j coupled in parallel with the pedal sensors 22b and a microprocessor sub-system 22k.

The analog-to-digital converters/latch circuits 22i firstly convert the pulse signals PUL1 to digital positional signals DPUL1, and are responsive to latch control signals supplied from the microprocessor sub-system 22k for temporally storing the digital positional signals DPUL1 from the associated photo-couplers 22f, if any.

The analog-to-digital converters/latch circuits 22j convert the analog positional signals PTN to digital positional signals, and are responsive to the latch control signals for storing the digital positional signals DPTN in a rewritable manner.

Namely, while the automatic player piano is in the recording mode, the microprocessor sub-system 22k periodically supplies the latch control signals to the analog-to-digital converters/latch circuits 22i and the analog-to-digital converters/latch circuits 22j, and fetches the digital positional signals DPUL1 and the digital positional signals DPTN. If one of the analog-to-digital converters/latch circuits 22i stores the digital positional signal DPUL1, the digital positional signal DPUL1 teaches that the associated key is depressed by the player, and a difference between the digital positional signals DPUL1 of the photo-coupler is indicative of variation of the key velocity. Then, the microprocessor sub-system produces a music data code indicative of a piece of music information on the basis of the MIDI (Musical Instrument Digital Interface) standards, by way of example. Therefore, the piece of music information contains note-on/note-off message, note information and velocity information.

Similarly, if the player steps on one of the pedals 21n, the associated pedal sensor 22b changes the value of the analog positional signal PTN from an initial value indicative of the home position thereof, and the associated analog-to-digital converter/latch circuit 22j changes the value of the stored digital positional signal DPTN. Then, the microprocessor sub-system 22k also produces another music data code indicative of another piece of music data information containing at least control change message, the identification of the manipulated pedal and the decrement/increment of the actual position.

The controller 22c further comprises a memory sub-system 22m. In the recording mode, the microprocessor sub-system 22k sequentially produces the music data codes as described above. The microprocessor sub-system 22k transfers the music data codes to the memory sub-system 22m, and the music data codes are stored therein in a non-volatile manner.

The controller 22c further comprises a servo-controlling sub-system 22n, digital-to-analog converters 22o and driver circuits 22p. The servo-controlling sub-system 22n cooperates with the microprocessor sub-system 22k in the playback mode, and controls the solenoid-operated key actuators 22d and the solenoid-operated pedal actuators 22e through the digital-to-analog converters 22o and the driver circuits 22p.

Figure 5:
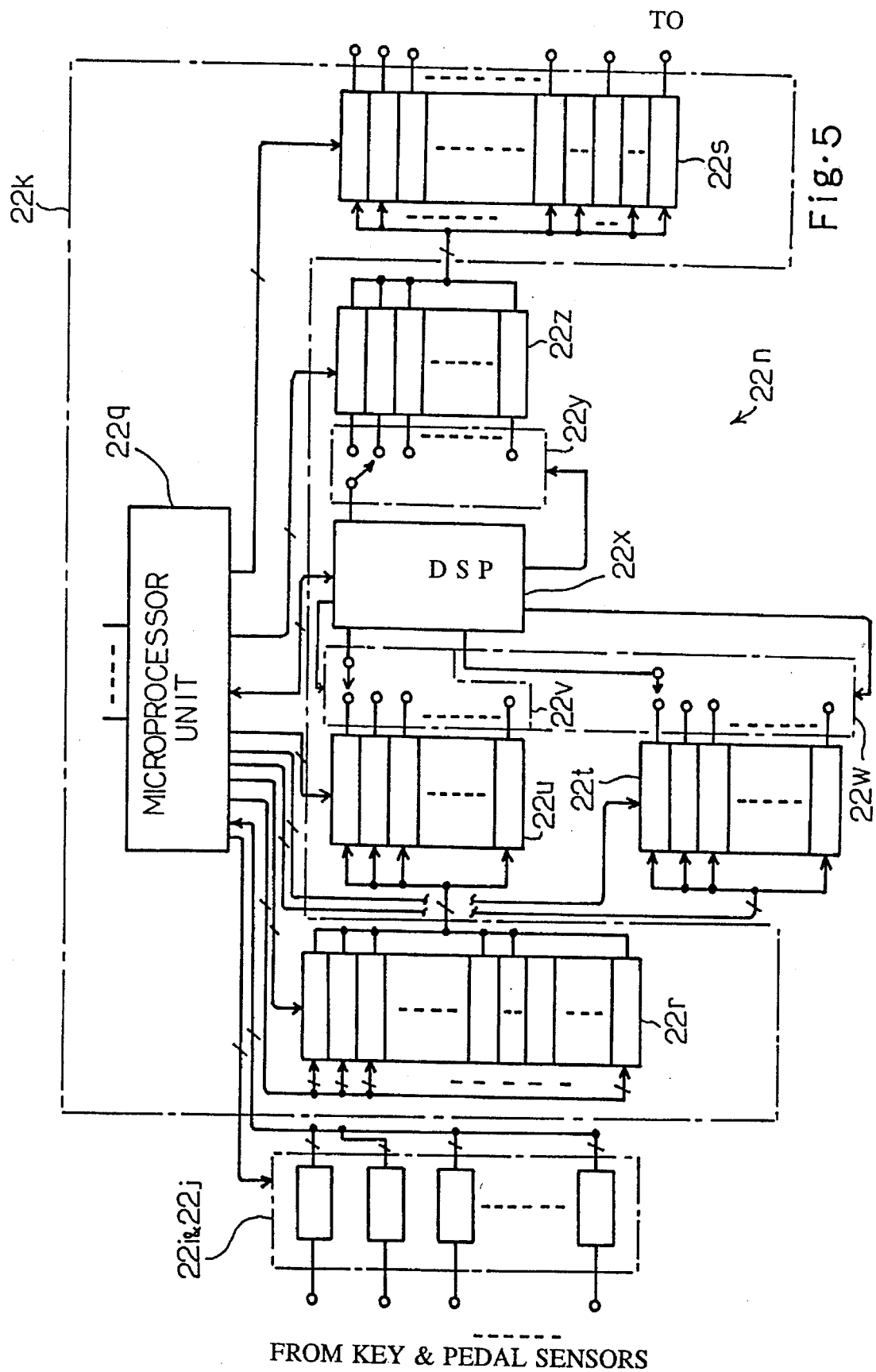
FIG. 5 is a block diagram showing the arrangement of a servo-controlling sub-system incorporated in the controller.

Turning to FIG. 5 of the drawings, essential parts of the microprocessor sub-system 22k are connected through various data and address paths with the servo-controlling sub-system 22n, and a microprocessor unit 22q, an array of data registers 22r and another array of data registers 22s are incorporated in the microprocessor sub-system 22k. The microprocessor unit 22q can execute various tasks, and, accordingly, has a program memory, a working memory, address and data buses, an interface unit etc. necessary for the tasks. However, they are not shown in the drawings.

The servo-controlling sub-system 22n comprises an array of data registers 22t, another array of data registers 22u, a time shared input switching unit 22v, a time shared input switching unit 22w, a digital signal processor 22x, a time shared output switching unit 22y and yet another array of data registers 22z. In this instance, the arrays of data registers 22r, 22t, 22u, 22z and 22s serve as a plurality of first data storage means, a plurality of second data storage means, a plurality of third data storage means, a plurality of fourth data storage means and a plurality of fifth data storage means, respectively, and the microprocessor unit 22q behaves as a control data source, a data selecting means, a data processing means and a transfer means.

The total of the key sensors 22a and the pedal sensors 22b are equal in number to the array of data registers 22r and the array of data registers 22s. in the playback mode, the data registers 22r are respectively assigned to digital key velocity codes indicative of the present or actual key velocities and the digital positional codes, and the data registers 22s are respectively assigned to the digital-control data signals for the solenoid-operated key/pedal actuators 22d and 22e.

The digital key velocity codes are produced from the differences between the digital positional signals DPUL1 by the microprocessor unit 22q, and the digital positional codes are transferred from the analog-to-digital converters/latch circuits 22j also by means of the microprocessor unit 22q. Therefore, the digital key velocity codes and the digital positional codes are respectively indicative of actual statuses of the associated keys 21b and the actual statuses of the pedals 21n. The digital control signals will be described below.

The number of the data registers 22t is less than the number of the data registers 22r, and is sixteen in this instance. Even if the automatic player piano according to the present invention is expected to reproduce a piano duet, the players can simultaneously manipulate the keys 21b and the pedal 21n not greater than sixteen in the recording mode, and, accordingly, the microprocessor unit 22q simultaneously handles the digital control signals less than sixteen in the playback mode. For this reason, the number of the data registers 22t is reasonable.

The data registers 22t are respectively assigned to music data codes extracted from the digital music data codes sequentially retrieved from the memory sub-system 22m in the playback mode. The music data codes stored in the data registers $22t$ are indicative of the target key velocities of the presently actuated keys $21b$ and the target positions of the presently actuated pedals $21n$. In other words, the data registers $22t$ respectively relate to the keys $21b$ and the pedals $21n$ actuated by the solenoid-operated key/pedal actuators $22d$ and $22e$ at every moment according to the performance selected in the playback mode.

The number of the data registers $22u$ is equal to the number of the data registers $22t$, and the digital key velocity/positional codes are transferred from the array of data registers $22r$ to the array of data registers $22u$ by means of the microprocessor unit $22q$. The digital key velocity/positional codes stored in the data registers $22u$ are associated with the keys $21b$ and the pedals $21n$ presently actuated, and are corresponding to the music data codes stored in the data registers $22t$, respectively. The note information and the identity information allow the microprocessor unit $22q$ to select the digital key velocity codes/positional code from the array of data registers $22r$.

The number of the data registers $22z$ is equal to the number of data registers $22u$, and stores the digital control signals for the presently actuated keys $21b$ and/or the pedals $21n$. The digital control signals are produced from the music data codes stored in the data registers $22t$ and the selected digital key velocity/positional codes stored in the array of data registers $22r$, and are indicative of increments/decrements of the key velocities and the pedal positions.

The digital signal processor $22x$ is abbreviated as "DSP" in FIG. 5, and synchronizes the time shared input switching units $22v$ and $22w$ and the time shared output switching unit $22y$ with one another. Therefore, the time shared switching units $22t$ and $22u$ couple one of the data registers $22t$ and one of the data registers $22u$ associated with a presently actuated key $21b$ or a presently actuated pedal $21n$ with the digital signal processor $22x$, and the time shared output switching unit $22y$ transfers the digital control signal produced from the digital key velocity/positional code and from the music data code to one of the data registers $22z$ also associated with the presently actuated key $21b$ or the presently actuated pedal $21n$.

The digital signal processor $22x$ is further operative to calculate a deviation of the actual key velocity or the actual pedal position from the target key velocity or the target pedal position. The actual key velocity/pedal position is read out from the data register $22u$ through the time shared switching unit $22v$, and the target key velocity/pedal position is read out from the data register $22t$ presently coupled through the time shared switching unit $22w$. The digital signal processor $22x$ produces the digital control signal on the basis of the calculated deviation, and the digital control signal intends to match the actual key velocity/pedal position with the target key velocity/pedal position. Therefore, the increment or the decrement of each digital control signal accelerates or decelerates the associated solenoid-operated actuator unit $22d$ or $22e$ for matching the actual key velocity/pedal position with the target key velocity/pedal position. The digital control signal thus produced is supplied from the digital signal processor $22x$ through the time shared switching unit $22y$ to one of the data registers $22z$, and is, thereafter, transferred to one of the data registers $22s$ assigned to the digital control signal for the presently actuated key $21b$ or the presently actuated pedal $21n$ under the control of the microprocessor unit $22q$. Since the microprocessor unit $22q$ memorizes the data registers $22r$ from which the digital key velocity codes are read out, the microprocessor unit $22q$ easily identifies the data registers $22s$ to which the digital control signals are transferred.

The digital control signals stored in the array of data registers $22s$ are supplied to the digital-to-analog converters $22o$, and are converted to analog control signals. The analog control signals causes the driver circuits $22p$ to keep or change the magnitude of analog diving signals DR1 and DR2.

Namely, if a key $21b$ or a pedal $21n$ does not relate to the music data codes listed in the data registers $22t$, the digital control signal in the associated data register $22s$ is indicative of the key velocity of zero or the home position, and the driver circuit $22p$ does not supply current to the associated solenoid-operated key actuator $22d$.

Even if the key $21b$ or the medal $21n$ relates to the music data codes in the data registers $22t$, the actual key velocity or the actual pedal position is matched with the target key velocity or the target pedal position, the digital control signal transferred from the data register $22z$ to the data register $22s$ is indicative of decrement/increment of zero, and the driver keeps the magnitude of the driving signal DR1 or DR2. As a result, the key $21b$ or the pedal $21n$ continues to move at the same velocity or to keep the actual pedal position.

However, if the actual key velocity or the actual pedal position is not matched with the target key velocity or the target pedal position, the digital control signal transferred from the data register $22z$ to the data register $22s$ causes the driver circuit $22p$ to increase or decrease the magnitude of the driving signal DR1 or DR2. As a result, the key $21b$ is accelerated or decelerated so as to match with the target key velocity, and the pedal $21n$ is advanced or returns toward the home position.

Figure 7A:
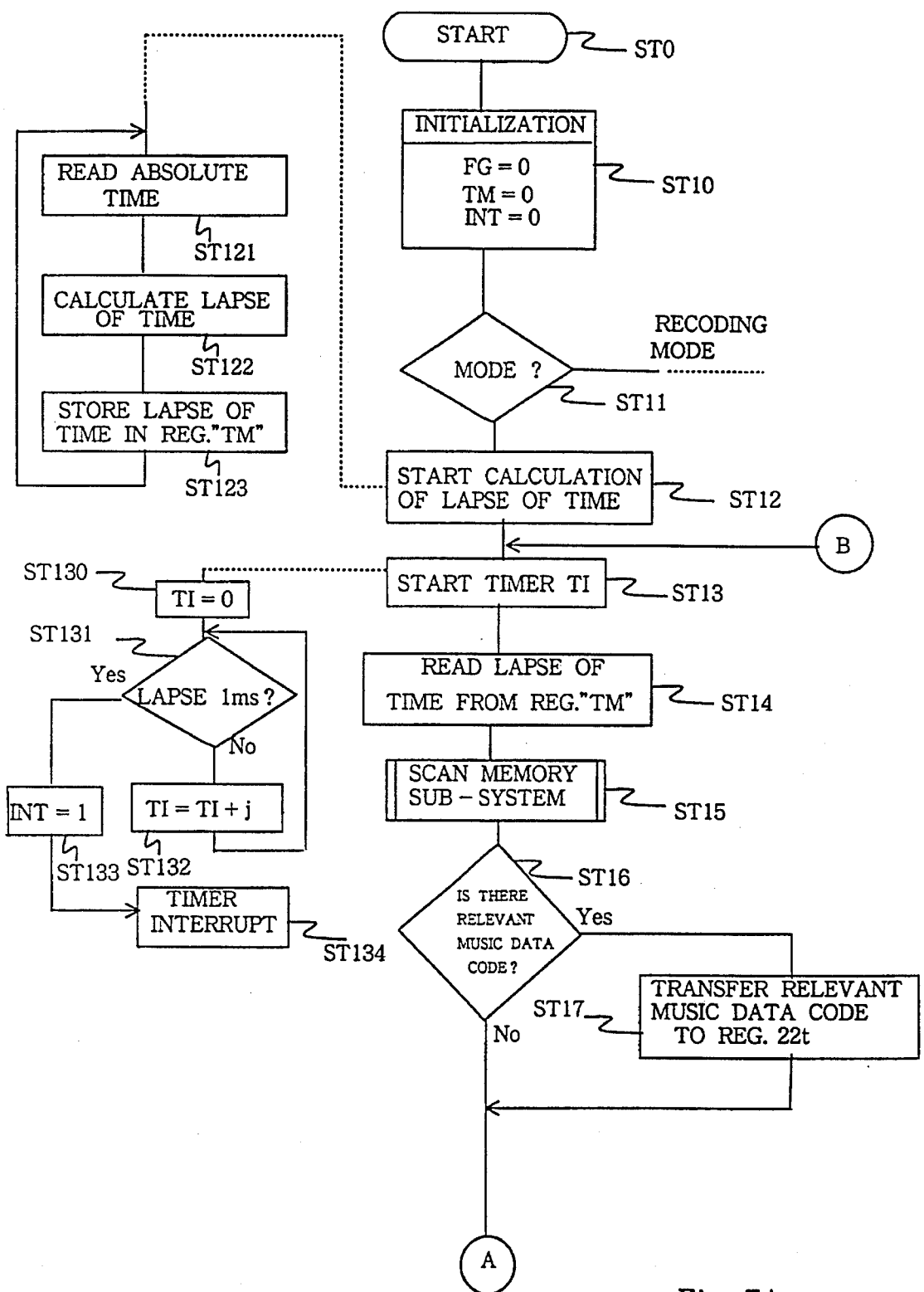
FIGS. 7A and 7B are flow charts showing a main program sequence executed by a microprocessor unit forming a part of the controller.
Figure 7B:
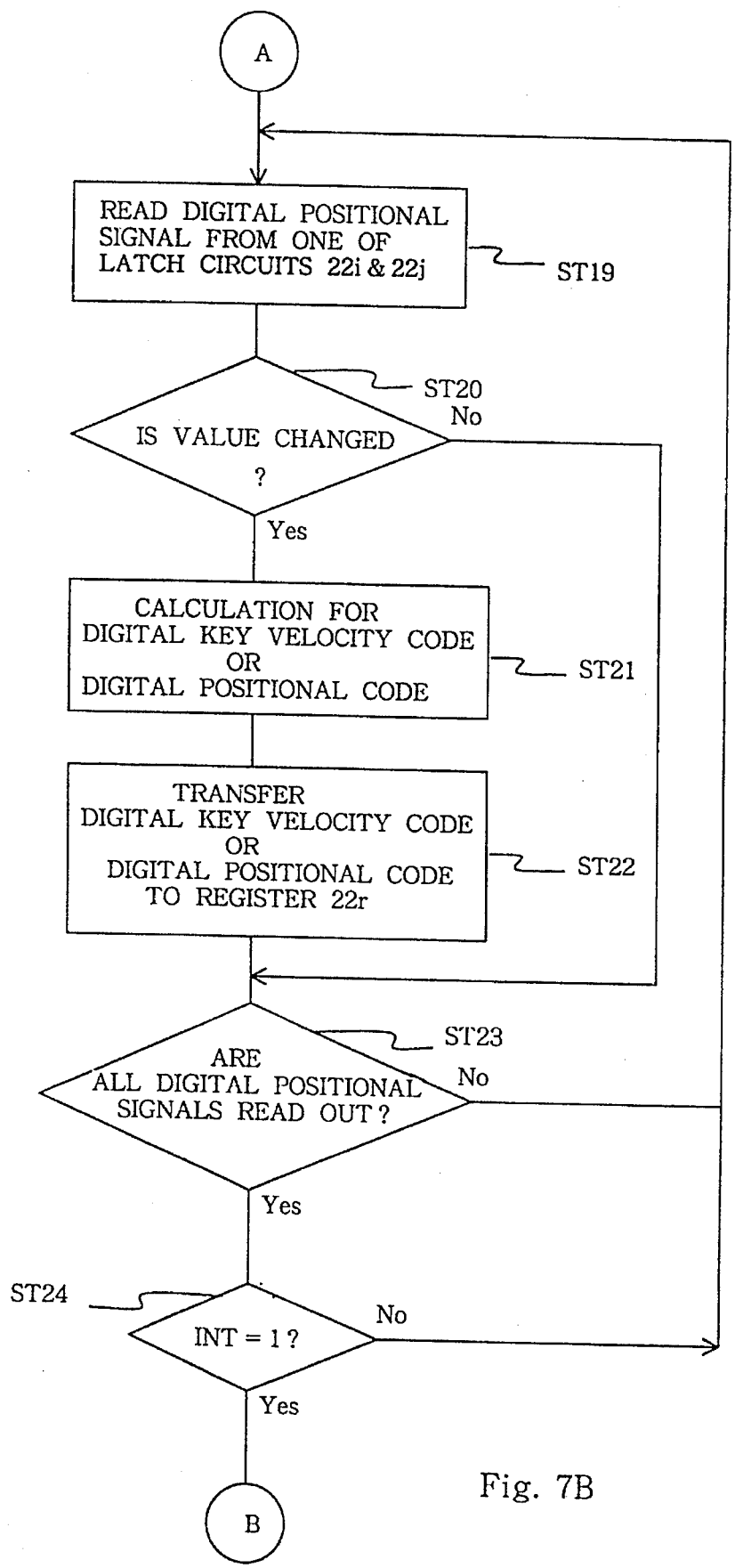

The microprocessor unit $22q$ achieves the above described tasks through a main program sequence shown in FIGS. 7A and 7B.

In the following description, each of the music data codes is assumed to contain a piece of time information indicative of a lapse of time from a start of a performance as well as a piece of key-on/pedal-on information indicative of a current supply or a piece of key-off/pedal-off information. The driver circuits $22p$ continues to supply the driving currents to the solenoid-operated key/pedal actuators from the time specified by the music data code containing the key-on/pedal-on information to the time specified by the music data code containing the key-off/pedal-off information. The key-off and the pedal-off are equivalent to a target key velocity of zero and a target pedal position of zero.

When the automatic player piano is powered on, the microprocessor unit $22q$ starts the main program sequence as by step ST0, and initializes available registers and flags as by step ST10. A time register TM for the lapse of time on an absolute time scale forms parts of the available registers, and the flags to be initialized contain a flag FG indicative of whether the transfer from the registers $22z$ to the registers $22s$ is executable and an interrupt flag INT indicative of an occurrence of a time interrupt.

The microprocessor $22q$ proceeds to step ST11, and checks whether the player selects the recording mode or the playback mode. If the player selects the recording mode, the microprocessor unit $22q$ executes a program sequence for the recording mode. However, the recording mode is less important to understand the present invention, and the program sequence for the recording mode and description are omitted for the sake of simplicity.

If the player instructs the playback mode to the microprocessor unit $22q$, the microprocessor unit $22q$ proceeds to step ST12, and starts a calculation of lapse of time as by step ST12. In detail, the present absolute time is periodically read by the microprocessor unit $22q$ as by step ST121, and calculates the difference between the present absolute time and the time at which the calculation starts as by step ST122. The lapse of time thus calculated is stored in the time registers TM as by step ST123, and the microprocessor unit 22q repeats the loop consisting of steps ST121 to ST123. Therefore, the contents of the time registers are periodically incremented.

Subsequently, the microprocessor unit 22q proceeds to step ST13, and starts a timer using a time register TI. Namely, the microprocessor unit 22q firstly initializes the time register TI as by step ST130, and checks the time register TI whether or not 1 millisecond lapses as by step ST131. If the answer at step ST131 is given negative, the microprocessor unit 22q proceeds to step ST132, and increments the timer or the content of the time register TI by a certain value i. The microprocessor unit 22q returns to step ST131, and reiterates the loop consisting of steps ST131 and ST132.

Figure 8:
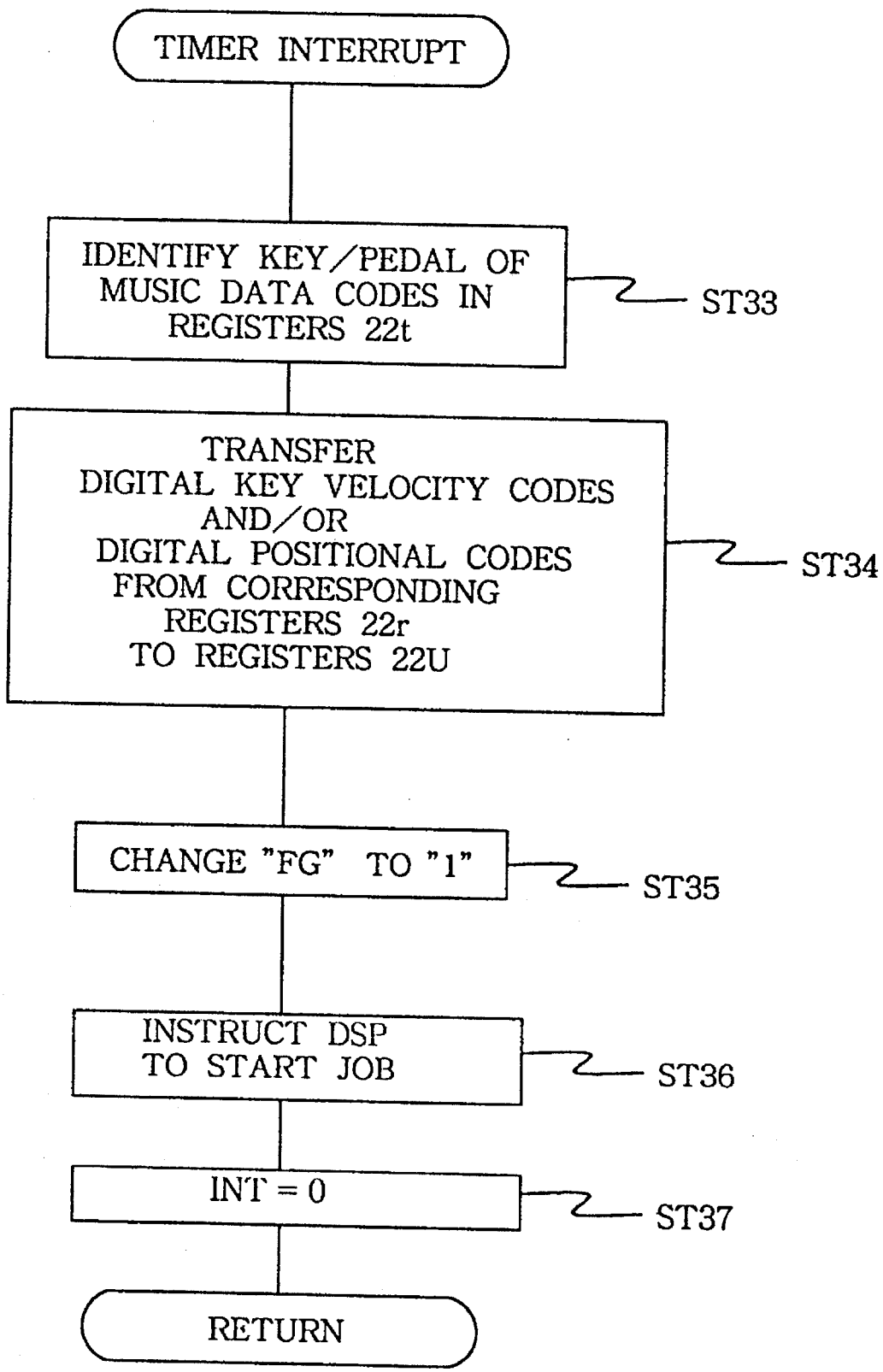
FIG. 8 is a flow chart showing a program sequence executed by the microprocessor unit upon a timer interrupt.

When 1 millisecond lapses, the answer at step ST131 is given affirmative, the microprocessor unit 22q changes the interrupt flag INT to zero as by step ST133, and a timer interrupt takes place as by step ST134. Thus, the timer interruption is requested at every 1 millisecond, and the timer interrupt program will be described below with reference to FIG. 8.

While the time register TI is periodically incremented, the microprocessor unit 22q executes the following steps.

The microprocessor unit 22q reads out the lapse of time from the time register TM as by step ST14, and scans the memory sub-system 22m so as to seek the music data codes to be presently executed as by step ST15.

After the scanning, the microprocessor unit 22q decides whether or not the music data codes to be executed are found as by step ST16. If the answer is given positive, the automatic player piano is expected to reproduce acoustic sounds, and the microprocessor unit 22q transfers the music data codes to be executed to available registers selected from the array of registers 22t as by step ST17. If a music data code contains the key-off/pedal-off information for a key or a pedal, the music data code is transferred to the register 22t storing the music data code containing the key-on/pedal-on information for the same key or pedal. The available registers 22t are the registers 22t initialized at step ST10 and the registers 22t still storing the music data codes containing the key-off/pedal-off information after a processing by the digital signal processor 22x.

However, if the answer at step ST16 is given negative, the microprocessor unit 22q proceeds to step ST19 without an execution of step ST17.

The microprocessor unit 22q reads the digital positional signal from one of the registers 22i/22j at step ST19, and checks the present value of the read-out digital positional signal to see whether or not the present value is changed from the previous value of the same digital positional signal as by step ST20.

If the answer at step ST20 is given affirmative, the key or the pedal is moved or requested to be moved, and the microprocessor unit 22q calculates a present key velocity code or a present pedal position. The microprocessor unit 22q produces the digital key velocity code or the digital positional code as by step ST21, and transfers the digital key velocity code or the digital positional code to corresponding one of the registers 22r as by step ST22. After the transferring operation, the microprocessor unit 22q proceeds to step ST23. However, if the answer at step ST20 is negative, the key or the pedal keeps the previous position, and the microprocessor unit 22q proceeds to step ST23 without executions of steps ST21 and ST22.

The microprocessor unit 22q decides at step ST23 whether or not present values are read out from all of the registers 22i and 22j. While the answer is given negative, the microprocessor unit 22q sequentially changes the register 22i/22j to be processed, and repeats the loop consisting of steps ST19 to ST23. Thus, the present key velocities and the present pedal positions are calculated, and are stored in the registers 22r. The present values of the digital positional signals are stored in internal registers of the microprocessor unit 22q as the previous values.

When all of the present key velocities and the present pedal positions are stored in the registers 22r, the answer at step ST23 is given affirmative, and the microprocessor unit 22q checks whether or not the interrupt flag INT is one as by step ST24. If the answer at step ST24 is given negative, the microprocessor unit 22q returns to step ST19, and repeats the calculation of the present key velocities and the present pedal positions through steps ST19 to ST23. In other words, the present key velocities and the present pedal positions stored in the registers 22r are periodically updated by the microprocessor unit 22q.

If the timer interrupt takes place during the execution of steps ST19 to ST24, the interrupt flag INT is changed to "1", and the answer at step ST24 is changed to affirmative after a return from the timer interrupt. Then, the microprocessor unit 22q returns to step ST13, and reiterates the loop consisting of steps ST12 to ST24.

Assuming now that 1 millisecond has lapsed, the answer at step ST131 is changed to affirmative, and the timer interruption takes place. Namely, the microprocessor unit 22q changes the interrupt flag ST133 to "1", and enters from step ST134 into a program sequence shown in FIG. 8.

The microprocessor unit 22q firstly identifies the keys and/or pedals represented by the music data codes stored in the registers 22t as by step ST33, and transfers the digital key velocity codes and/or the digital positional codes from the corresponding registers 22r to the registers 22u paired with the registers 22t as by step ST34. As a result, the pairs of registers 22t and 22u store the target key velocities/target pedal positions and the actual key velocities/actual pedal positions.

The microprocessor unit 22q proceeds to step ST35, and changes the flag FG to "1", and the microprocessor unit 22q instructs the digital signal processor 22x to start jobs as by step ST36. The microprocessor unit 22q changes the interrupt flag INT to zero as by step ST37, and returns to the main program sequence so as to restart the loop consisting of steps ST19 to ST24.

Figure 9A:
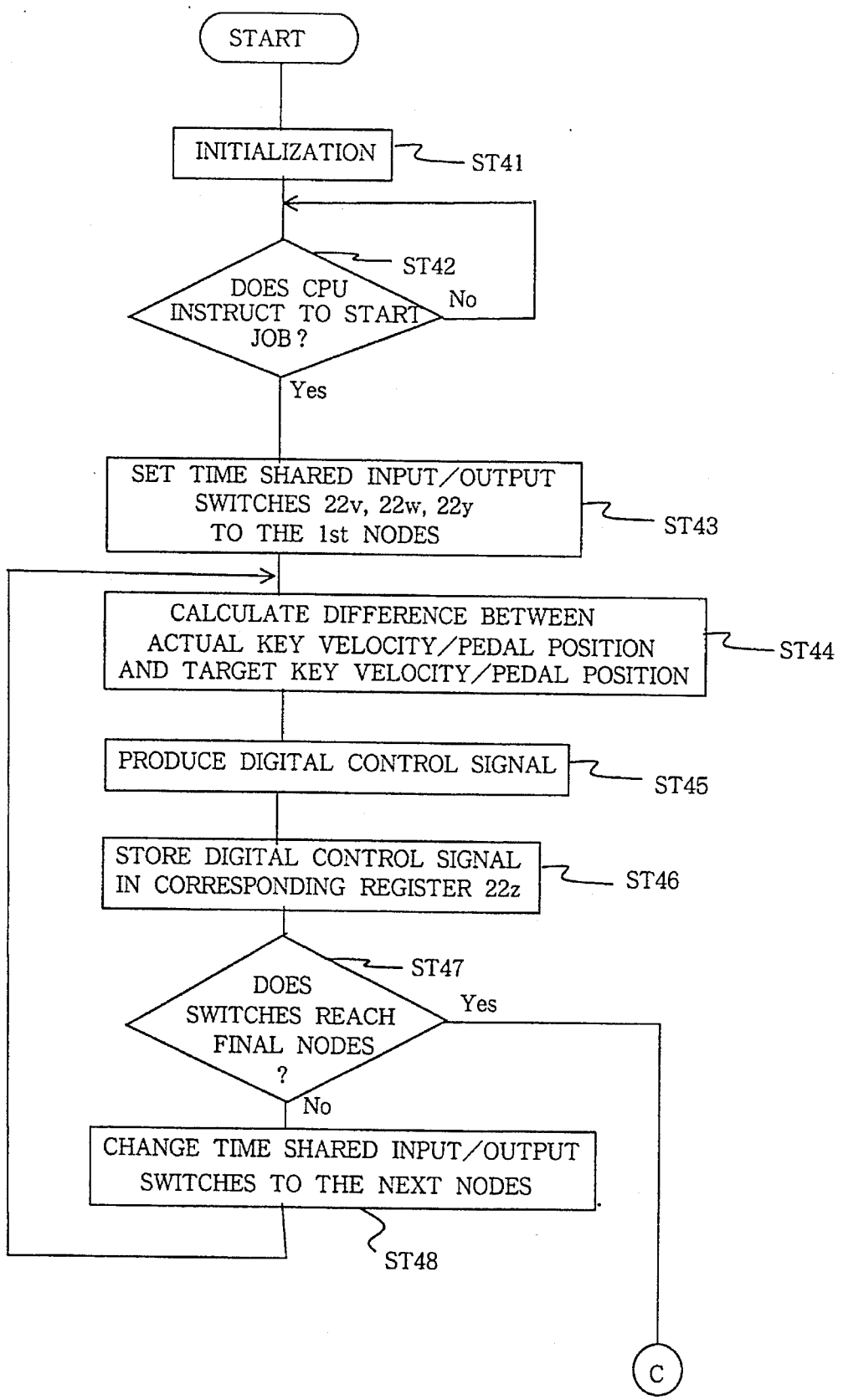
FIGS. 9A and 9B are flow charts showing a main program sequence executed by a digital signal processor incorporated in the controller.
Figure 9B:
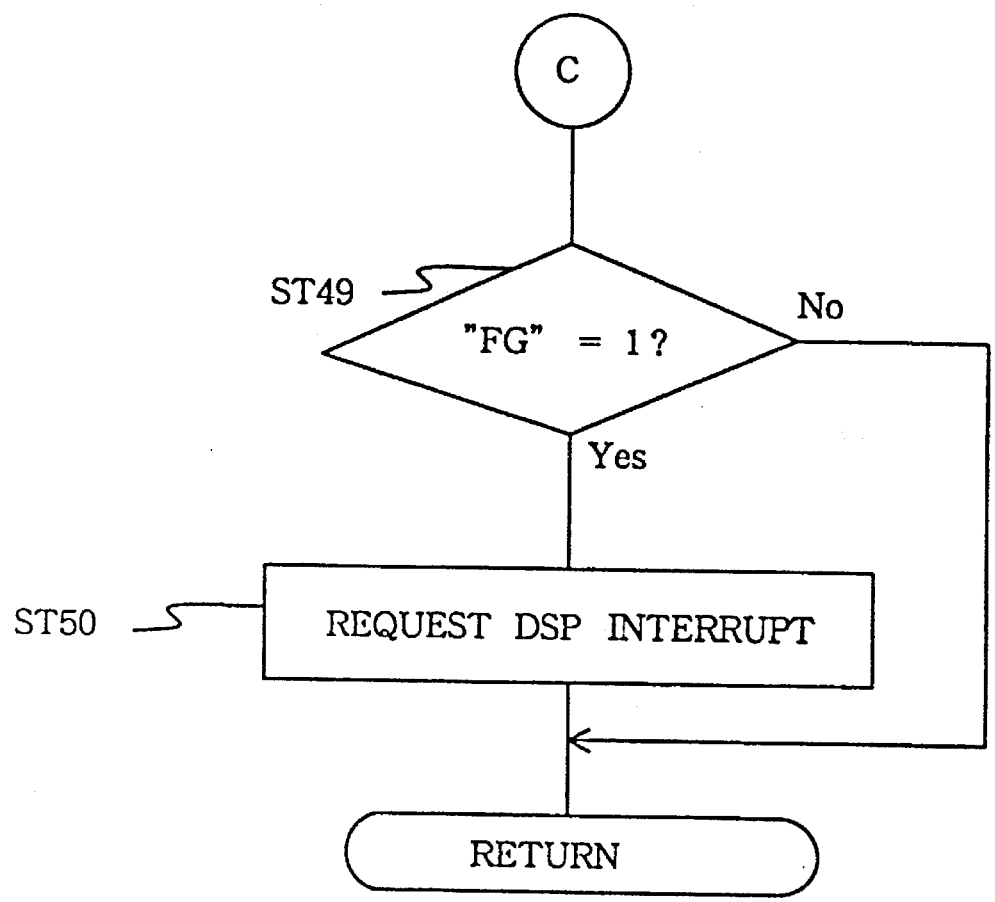

The digital signal processor 22x sequentially executes steps shown in FIGS. 9A and 9B. Namely, when the automatic player piano is powered on, the digital signal processor 22x initializes available registers as by step ST41, and waits for the starting instruction at step ST42. When the microprocessor unit 22q instructs the job at step ST36, the answer at step ST42 is changed to affirmative, and digital signal processor 22x changes the time shared input/output switches 22v, 22w and 22y to the first nodes as by step ST43.

Then, the target key velocity or the target pedal position and the corresponding actual key velocity or the actual pedal position are transferred to the digital signal processor 22x, and the digital signal processor 22x calculates a difference between the target key velocity/target pedal position and the actual key velocity/actual pedal position as by step ST44.

Thereafter, the digital signal processor 22x produces the digital control signal as by step ST45, and the digital control signal is stored in a corresponding one of the registers 22z through the time shared output switch unit 22y as by step ST46.

Subsequently, the digital signal processor 22x checks whether or not all the pairs of registers 22t/22u are accessed as by step ST47. While the answer at step ST47 is given negative, the digital signal processor 22x change is the nodes of the time shared input/output switch units 22v, 22w and 22y as by step ST48, and reiterates the loop consisting of steps ST44 to ST48. As a result, the digital signal processor 22x calculates the differences between all of the target key velocities/target pedal positions and all of the actual key velocities/actual pedal positions, and the digital control signals are stored in the registers 22z.

When the digital control signals are stored in all of the registers 22z, the answer at step ST47 is changed to affirmative, and the digital signal processor 22x proceeds to step ST49.

Since the microprocessor 22q changed the flag FG to "1" at step ST35, the answer at step ST49 is usually given affirmative, and the digital signal processor 22x requests an interruption to the microprocessor unit 22q as by step ST50. The interruption requested by the digital signal processor 22x is referred to as "DSP Interrupt".

Figure 10:
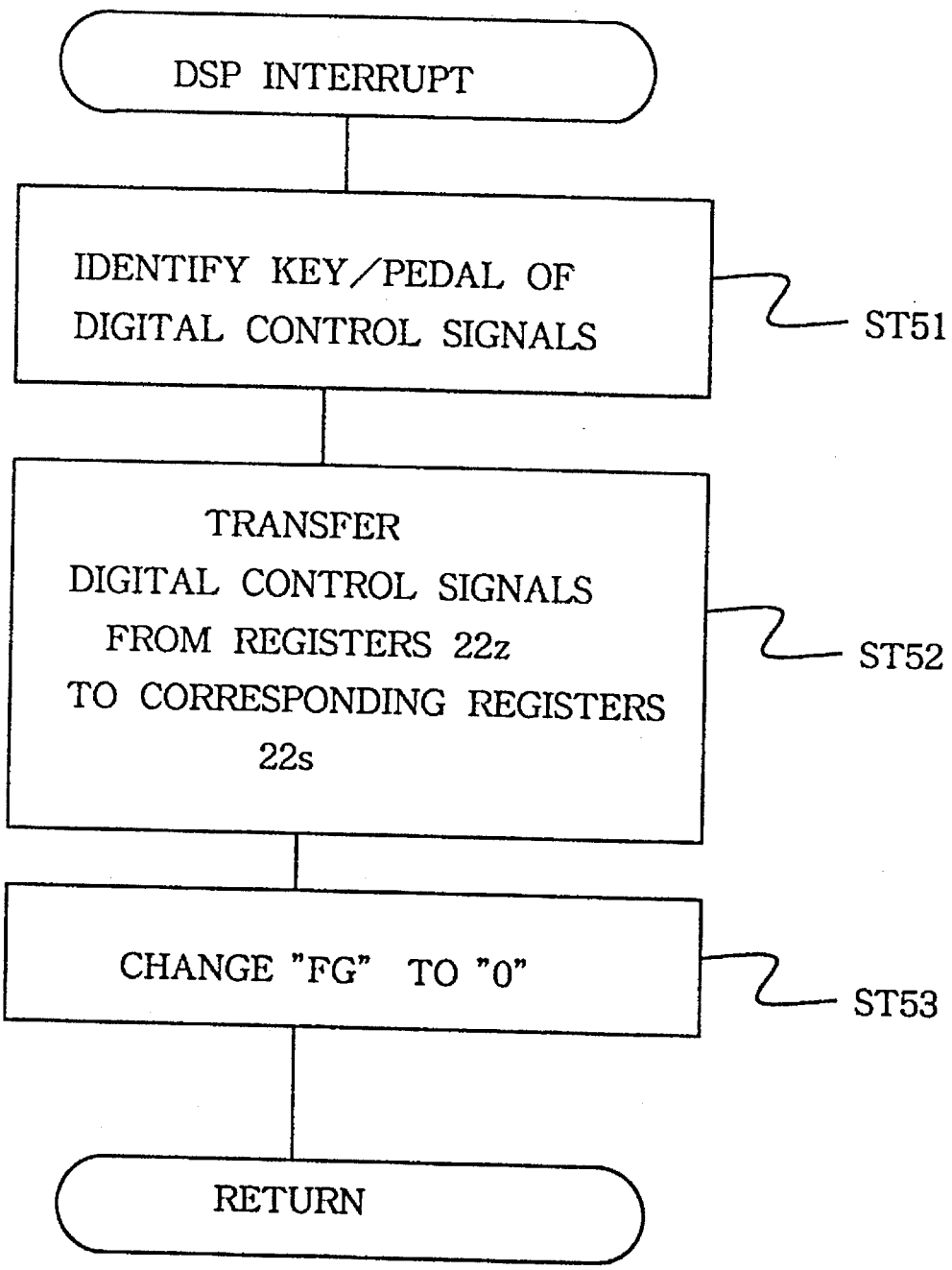
FIG. 10 is a flow chart showing a program sequence executed by the microprocessor unit upon an interrupt requested by the digital signal processor.

When the DSP interrupt is requested, the microprocessor unit 22q starts a program sequence shown in FIG. 10. The microprocessor unit 22q firstly identifies the keys and/or pedals to be controlled with the digital control signals stored in the registers 22z as by step ST51, and transfers the digital control signals to the registers 22s assigned to the keys and/or pedals to be controlled as by step ST52. The digital control signals are transferred from the registers 22s to the digital-to-analog converters 22o, and the driver circuits 22p supply the driving currents to the solenoid-operated key/pedal actuators. As described above, the digital control signals cause the solenoid-operated key/pedal actuators to decrease the differences between the target key velocities/target pedal positions and the actual key velocities/actual pedal positions, and the solenoid-operated key/pedal actuators move the keys and pedals along the trajectories in the recording mode.

After the execution of step ST53, the central processing unit 22q returns to the main program sequence.

In a modification, the music data code contains the key code information, a piece of time information indicative of a starting time of driving current and another piece of time information indicative of a termination time of the driving current. The music data code is stored in the registers 22t from the starting timing to the termination timing, and the microprocessor cancels the music data code at the terminating time. The microprocessor unit 22q manages the available registers 22t, and transfers the music data codes having the starting times reaching the absolute time to the available registers 22t through time slots controlled in a time sharing fashion.

Figure 1:
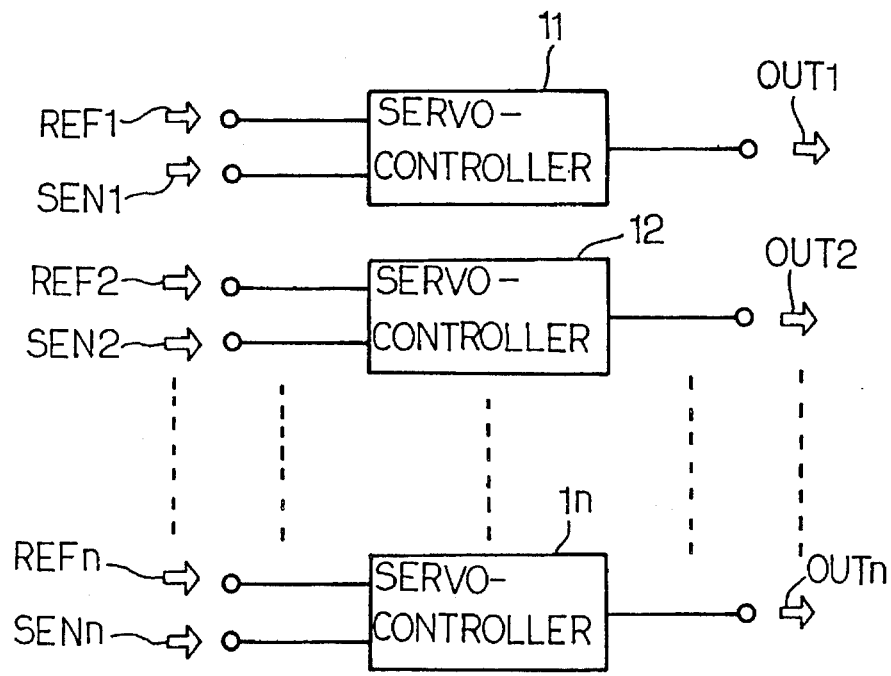
FIG. 1 is a block diagram showing the first prior art servo-controlling system.
Figure 2:
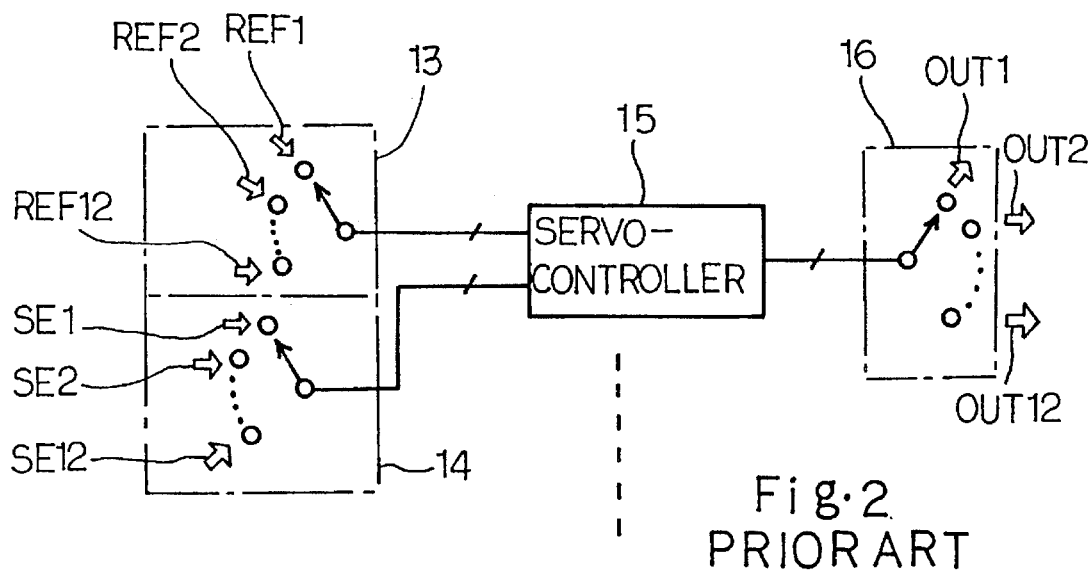
FIG. 2 is a block diagram showing the second prior art servo-controlling system.

As will be appreciated from the flow charts (FIGS. 7A–10), the servo-controlling sub-system according to the present invention calculates the deviations only for the selected keys 21b and pedal 21n, and the time shared input and output switching units 22v, 22w and 22y sequentially couple the selected data registers with the digital signal processor 22x. As a result, only one digital signal processor 22x can control all of the feedback loops in a real time fashion, and the wirings are simpler rather than that of the prior art shown in FIG. 1.

Second Embodiment

Figure 6:
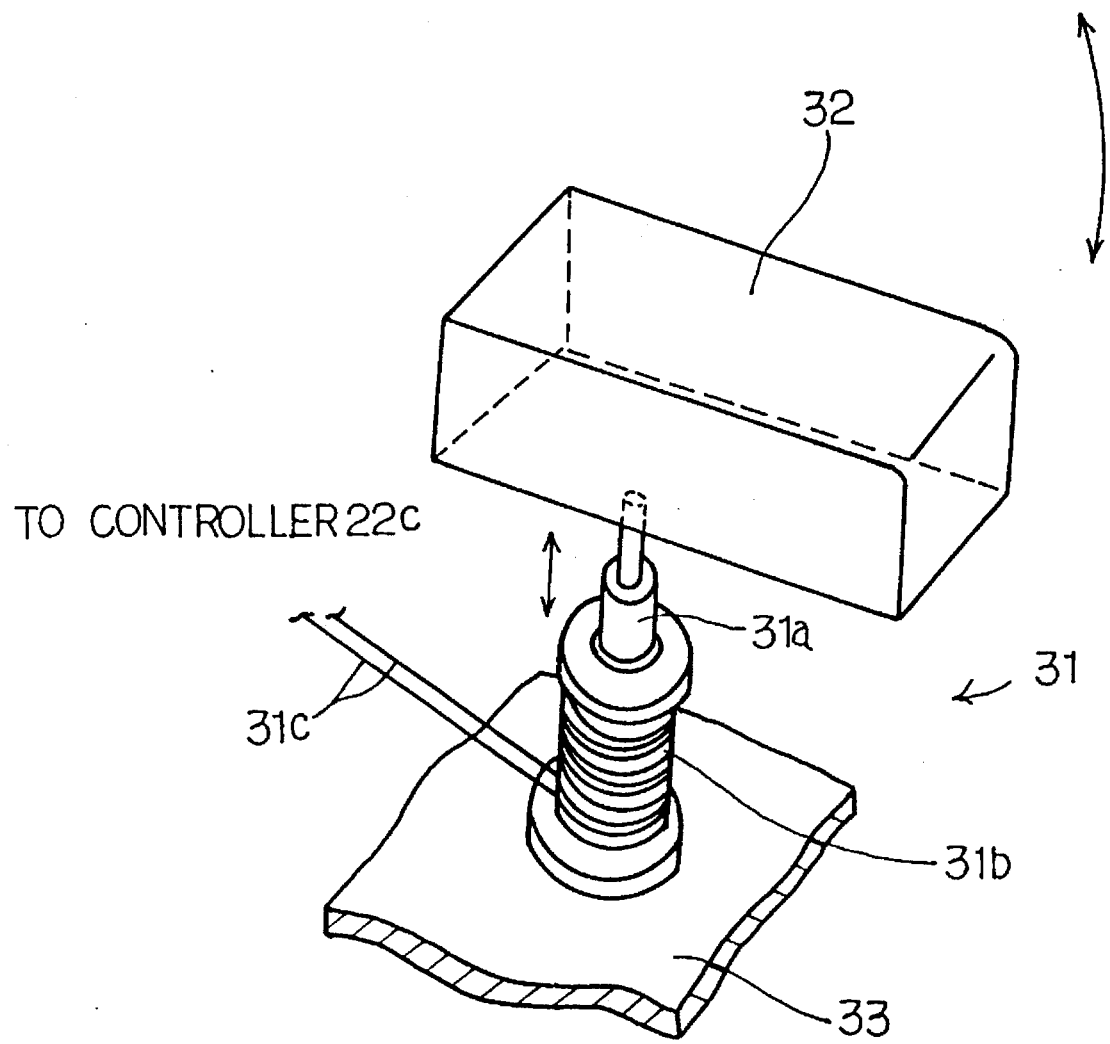
FIG. 6 is a perspective view showing a key sensor incorporated in another automatic player piano according to the present invention.

Turning to FIG. 6 of the drawings, a key sensor 31 incorporated in another automatic player piano is associated with one of black and white keys 32. The automatic player piano implementing the second embodiment is similar to the first embodiment except for the key sensor 31, and detailed description on the other components is omitted for avoiding repetition.

The key sensor 31 comprises a permanent magnet piece 31a attached to a lower surface of the key 32 and a coil unit 31b mounted on a key bed 33. The permanent magnet piece 31a is movable into and out of the coil unit 31b, and causes the coil unit 31b to produce electromagnetic induction current. The amount of the electromagnetic induction current is variable with the relative location between the permanent magnetic piece 31a and the coil unit 31b, and serves as similar to the pulse signal PUL1. The coil unit 31b is connected through wirings 31c with one of the analog-to-digital converters/latch circuits 22i of the controller 22c, and the electromagnetic induction current is converted into the digital positional signal DPUL1.

The automatic player piano selectively enters into the standard playing mode, the recording mode and the playback mode, and behaves as similar to the first embodiment.

Although particular embodiments of the present invention have been shown and described, it will be obvious to those skilled in the art that various changes and modifications may be made without departing from the spirit and iscope of the present invention. For example, data coding system such as the MIDI system does not set a limitation on the servo-controlling system according to the present invention, and a servo-controlling system according to the present invention may handle a key positional signal and a pedal velocity signal.

What is claimed is:

1. A servo-controlling system for controlling a plurality of movable members, comprising:

a) a plurality of sensor means respectively associated with a plurality of movable members for respectively producing a plurality of first data signals respectively indicative of an actual status of said plurality of movable members, each of said actual status being variable with time if said associated movable member is moved;

b) a plurality of first data storage means respectively associated with said plurality of sensor means for storing said plurality of first data signals;

c) a control data source for sequentially producing a plurality of second data signals indicative of a target status of said plurality of movable members to be controlled respectively, said plurality of second data signals being less in number than said plurality of first data signals;

d) a plurality of second data storage means for respectively storing said plurality of second data signals supplied from said control data source;

e) data selecting means for selecting from said plurality of first data signals stored in said plurality of first data storage means signals indicative of the actual status of said plurality of movable members to be controlled corresponding to said plurality of second data signals stored in said plurality of second data storage means;

f) a plurality of third data storage means for storing said selected first data signals;

g) a first input switching unit having first input ports respectively coupled with said plurality of second data storage means and a first output port, for sequentially connecting said first input ports with said first output port;

h) a second input switching unit having second input ports respectively coupled with said plurality of third data storage means and a second output port, for sequentially connecting said second input ports with said second output port in synchronism with said first input switching unit;

i) an output switching unit having a third input port and a plurality of third output ports, for sequentially connecting said third input port with said plurality of third output ports in synchronism with said first and second input switching units;

j) data processing means coupled with said first and second output ports, for sequentially producing a plurality of control signals for matching said actual status with said target status, respectively, said plurality of control signals being sequentially supplied to said third input port;

k) a plurality of fourth data storage means for storing said plurality of control signals;

l) a plurality of fifth data storage means respectively associated with said plurality of first data storage means, for selectively storing said plurality of control signals;

m) transfer means operative to transfer said plurality of control signals from said plurality of fourth data storage means to said plurality of fifth data storage means; and n) a plurality of actuator means respectively associated with said plurality of movable members, and respectively coupled with said plurality of fifth data storage means, at least one of said plurality of actuator means being respectively responsive to said control signals for matching the actual status of the associated movable members with the target status according to said plurality of control signals.

2. The servo-controlling system as set forth in claim 1, wherein said plurality of moveable members include a plurality of keys and pedals of a keyboard instrument, and said plurality of sensor means include a plurality of key and pedal sensors for monitoring said plurality of keys and pedals.

3. The servo-controlling system as set forth in claim 2, in which said key sensors and said pedal sensors produce said plurality of first data signals indicative of actual key velocities and of actual pedal positions with respect to home positions of said pedals.

4. The servo-controlling system as set forth in claim 2, wherein said first data signals comprise key velocity signals and said plurality of first data storage means store key velocity signals and, wherein said plurality of first data storage means are equal in number to the total number of said keys and said pedals.

5. The servo-controlling system as set forth in claim 4, in which said plurality of first data storage means store key velocity signals indicative of actual key velocities of said keys and pedal positional signals indicative of actual pedal positions of said pedals with respect to home positions of said pedals.

6. The servo-controlling system as set forth in claim 5, in which said control data source supplies music data codes serving as said plurality of second data signals and indicative of target key velocities of said keys and of target pedal positions of said pedals with respect to home positions of said pedals to said plurality of second data storage means.

7. The servo-controlling system as set forth in claim 2, in which said control data source supplies music data codes serving as said plurality of second data signals and indicative of target key velocities of said keys and of target pedal positions of said pedals with respect to home positions of said pedals to said plurality of second data storage means.

8. A keyboard instrument comprising:

a) a plurality of keys rotatably supported with respect to a stationary board member;

b) a plurality of string means respectively associated with said plurality of keys for producing tones;

c) a plurality of hammer mechanisms associated with said plurality of string means, respectively, for striking the associated string means;

d) a plurality of key action mechanisms respectively coupled between said plurality of keys and said plurality of hammer mechanisms, for driving the associated hammer mechanisms for rotation when the associated keys are depressed;

e) a plurality of pedal mechanisms operative to change an impression of said tones;

f) a plurality of key sensors respectively associated with said plurality of keys, for monitoring said plurality of keys and for producing first data signals indicative of an actual status of said plurality of keys;

g) a plurality of pedal sensors respectively associated with said plurality of pedal mechanisms for monitoring said plurality of pedal mechanisms and for producing a plurality of second data signals indicative of an actual status of said plurality of pedal mechanisms, respectively;

h) a controller comprising:

h-1) a plurality of first data storage means for storing said plurality of first data signals and said plurality of second data signals, respectively, h-2) a control data source for sequentially producing a plurality of third data signals indicative of a target status of said plurality of keys to be controlled in a playback and a target status of said plurality of pedal mechanisms to be controlled in said playback, respectively, said plurality of third data signals being less in number than the total of said plurality of first data signals and said plurality of second data signals, h-3) a plurality of second data storage means for storing said plurality of third data signals, respectively, h-4) data selecting means for selecting data signals from said plurality of first and second data signals stored in said plurality of first data storage means, the selected data signals corresponding to said plurality of third data signals stored in said plurality of second data storage means, h-5) a plurality of third data storage means for storing said selected data signals, h-6) a first input switching unit having first input ports respectively coupled with said plurality of second data storage means and a first output port, for sequentially connecting said first input ports with said first output port, h-7) a second input switching unit having second input ports respectively coupled with said plurality of third data storage means and a second output port, for sequentially connecting said second input ports with said second output port in synchronism with said first input switching unit, h-8) an output switching unit having a third input port and a plurality of third output ports, for sequentially connecting said third input port with said plurality of third output ports in synchronism with said first and second input switching units, h-9) data processing means coupled with said first and second output ports, for sequentially producing a plurality of control signals in accordance with said third data signals and said selected data signals, for matching said actual status represented by said selected data signals with said target status represented by said third data signals, said plurality of control signals being sequentially supplied to said third input port, h-10) a plurality of fourth data storage means for storing said plurality of control signals, respectively, h-11) a plurality of fifth data storage means respectively associated with said plurality of first data storage means, for selectively storing said plurality of control signals, and h-12) transfer means operative to transfer said plurality of control signals from said plurality of fourth data storage means to selected ones of said plurality of fifth data storage means; and i) a plurality of actuator units, respectively associated with said plurality of keys and with said plurality of pedal mechanisms, and respectively coupled with said plurality of fifth data storage means, selected ones of said plurality of actuator units being respectively responsive to said plurality of control signals for matching said actual status with said target status.

9. A servo-controlling system for controlling a plurality of movable members, comprising:

a) a plurality of sensor means respectively associated with said plurality of movable members for respectively producing a plurality of first data signals respectively indicative of an actual status of said plurality of movable members;

b) a control data source for sequentially producing a plurality of second data signals indicative of a target status of said plurality of movable members to be controlled respectively;

c) data selecting means for selecting first data signals from said plurality of first data signals;

d) at least one data storage device for storing any of the first data signals, the second data signals and the selected first data signals;

e) at least one input switching unit having a plurality of input switching input ports coupled with said at least one data storage device for receiving at least one of said second data signals and said selected first data signals, and having at least one input switching output port;

f) an output switching Unit having an output switching input port and a plurality of output switching output ports, for sequentially connecting said output switching input port with said plurality of output switching output ports in synchronism with said at least one input switching unit;

g) data processing means coupled with said at least one input switching output port, for sequentially producing a plurality of control signals used for matching said actual status with said target status, respectively, said plurality of control signals being sequentially supplied to said output switching input port, wherein said at least one data storage device stores said plurality of control signals;

h) a plurality of actuator means responsive to said control signals, for matching the actual status of the associated movable members with the target status represented by said plurality of control signals, said plurality of actuator means respectively associated with said plurality of movable members and coupled with said at least one data storage device.

* * * * *